United States Patent
Lu et al.

(10) Patent No.: US 10,714,690 B2
(45) Date of Patent: Jul. 14, 2020

(54) AUTO-POLYMERIZATION ELECTRIC STORAGE MATERIAL BASED ON DOPAMINE, PREPARATION METHOD THEREOF AND APPLICATION TO ELECTRIC STORAGE DEVICE THEREOF

(71) Applicant: SOOCHOW UNIVERSITY, Suzhou (CN)

(72) Inventors: Jianmei Lu, Suzhou (CN); Jinghui He, Suzhou (CN)

(73) Assignee: SOOCHOW UNIVERSITY, Suzhou (CN)

( * ) Notice: Subject to any disclaimer, the term of this patent is extended or adjusted under 35 U.S.C. 154(b) by 0 days.

(21) Appl. No.: 16/380,809

(22) Filed: Apr. 10, 2019

(65) Prior Publication Data

US 2019/0319193 A1    Oct. 17, 2019

(30) Foreign Application Priority Data

Apr. 11, 2018 (CN) .......................... 2018 1 0323037

(51) Int. Cl.
*H01L 51/00* (2006.01)
*C08G 73/02* (2006.01)
*C08J 5/18* (2006.01)

(52) U.S. Cl.
CPC ........ *H01L 51/0035* (2013.01); *C08G 73/026* (2013.01); *C08J 5/18* (2013.01); *H01L 51/0026* (2013.01); *H01L 51/0031* (2013.01); *C08J 2379/02* (2013.01); *H01L 2251/308* (2013.01)

(58) Field of Classification Search
CPC ............. H01L 51/0035; H01L 51/0026; H01L 51/0031; H01L 2251/308; C08G 73/026; C08J 5/18; C08J 2379/02

USPC .......................................................... 257/40
See application file for complete search history.

(56) References Cited

U.S. PATENT DOCUMENTS

| | | | |
|---|---|---|---|
| 2004/0256662 A1* | 12/2004 | Black | B82Y 10/00 257/317 |
| 2007/0187768 A1* | 8/2007 | Duan | B82Y 10/00 257/368 |
| 2009/0101962 A1* | 4/2009 | Hong | B82Y 10/00 257/322 |

(Continued)

OTHER PUBLICATIONS

Machine English Translation of Chinese Patent Publication No. CN109355907 (Year: 2019).*

*Primary Examiner* — Dzung Tran
(74) *Attorney, Agent, or Firm* — SZDC Law P.C.

(57) ABSTRACT

The invention discloses a dopamine-based self-polymerization electric storage material and a preparation method thereof and the application thereof in an electric storage device, and the self-polymerization of dopamine is generated by solving the problems of complicated preparation process, poor environment and high temperature stability of the current organic electric storage material. The organic electric storage device prepared by the polymer into a sandwich structure successfully realizes the organic electric storage behavior. In the preparation process, the molecular synthesis and the device preparation are completed simultaneously, the device environment and the high temperature stability are good, and it is of great significance to the research progress of the organic electric storage technology and practical value.

11 Claims, 5 Drawing Sheets

(56) References Cited

U.S. PATENT DOCUMENTS

| | | | |
|---|---|---|---|
| 2009/0243048 A1* | 10/2009 | Dufourcq | C23C 16/402 |
| | | | 257/632 |
| 2010/0039846 A1* | 2/2010 | Lai | B82Y 10/00 |
| | | | 365/51 |
| 2016/0126329 A1* | 5/2016 | Vellaisamy | H01L 29/0673 |
| | | | 257/325 |

* cited by examiner

AUTO-POLYMERIZATION ELECTRIC STORAGE MATERIAL BASED ON DOPAMINE, PREPARATION METHOD THEREOF AND APPLICATION TO ELECTRIC STORAGE DEVICE THEREOF

This application claims priority to Chinese Patent Application No. 201810323037.6, filed on Apr. 11, 2018, which is incorporated by reference for all purposes as if fully set forth herein.

FIELD OF THE INVENTION

The present invention belongs to the technical field of organic polymer materials, with simultaneously completion of molecular synthesis and device preparation, in particularly relates to an electrical storage material based on self-polymerization of dopamine.

TECHNICAL BACKGROUND

Since the 1960s, it has entered the era of fifth information technology revolution. Its main symbol is the popularity and application of electronic computers. However, after computer technology has been developed for 57 years, it follows that the amount of information that computer has to deal with is increasing rapidly, and the corresponding information storage technology must also meet the needs. Therefore, the research and breakthrough of large-capacity, high-density storage devices is indispensable. In the background that traditional storage technologies cannot meet the demand for a large amount of information storage, organic storage technology has attracted more and more attention. The generation of ternary storage technology has increased the storage capacity of information from $2^n$ to $3^n$ or even $4^n$. Exponential growth is of great significance for the enhancement of information storage capacity. For organic polymer materials, the main problems currently existed are complex device preparation methods, poor repeatability, and poor high temperature resistance.

SUMMARY OF THE INVENTION

In view of the current complicated preparation process, poor environmental and high temperature stability of organic electrical storage materials, the organic electrical storage device with sandwich structure can be prepared by self-polymerization of dopamine, so as to successfully realize the organic electrical storage behavior. Molecular synthesis and device preparation are completed at the same time, and the device environment and high temperature stability are good, which is of great significance for the research guidance and practical value of organic electric storage technology.

The present invention adopts the following technical solutions:

A preparation method of a self-polymerization electric storage material, comprising the following steps: mixing a dopamine hydrochloride solution having a pH of 8 to 9 with copper sulfate pentahydrate and hydrogen peroxide to obtain a mixed solution; then forming a film with the mixed solution and annealing, to obtain the self-polymerization electric storage material.

The present invention also disclosed a preparation method of an electric storage device, comprising the following steps: mixing a dopamine hydrochloride solution having a pH of 8 to 9 with copper sulfate pentahydrate and hydrogen peroxide to obtain a mixed solution; then forming a film on the conductive surface of a conductive substrate with the mixed solution and annealing, and finally preparing electrodes, to obtain the electric storage device.

In the above technical solutions, the pH of said dopamine hydrochloride solution is adjusted to 8 to 9 by hydrochloric acid buffer.

In the above technical solutions, said dopamine hydrochloride solution is a dopamine hydrochloride aqueous solution.

In the above technical solutions, the temperature of annealing is 30° C., time of annealing is 11 to 13 hours.

In the above technical solutions, the concentration of said dopamine hydrochloride solution is 8 mg/mL to 11 mg/mL.

In the above technical solutions, said film is formed by dipping method.

In the above technical solutions, the conductive substrate is ITO glass, preferably washed ITO glass. Preferably, said ITO glass is sequentially washed with washing powder, acetone, ethanol, and a cleaning solution, said cleaning solution is selected from concentrated sulfuric acid and hydrogen peroxide. The added cleaning solution effectively hydroxylates the conductive surface, and the surface of the film is completely cleaned to reduce the roughness of the prepared device.

In the above technical solutions, the mass ratio of the dopamine hydrochloride, copper sulfate pentahydrate and hydrogen peroxide is 1000:(120 to 130):(66 to 67).

Different pH, different polymerization products, different solution concentrations, different polymerization rates lead to different film thicknesses; different post-treatment temperatures and times, film surface flatness is different, and forming the film on the conductive surface in solution at room temperature, using dipping method; whether to add in copper sulfate pentahydrate and hydrogen peroxide or not, the different reaction speed of self-polymerization, result in different thickness of the film formation.

The present invention also discloses a self-polymerization electric storage material prepared by the above method, and an electric storage device prepared by the above preparation method.

The present invention also discloses the application of the self-polymerization electric storage material.

The application of dopamine hydrochloride in the preparation of electric storage device; or the application of dopamine hydrochloride in the preparation of self-polymerization electric storage material for electric storage device.

Specifically, the electric storage device of the present invention can be fabricated as follows:

(1) ITO glass is first cleaned by washing powder (the standard of washing is ITO surface is bright and transparent, no water stain), then ultrasonic cleaning with ultrapure water, acetone and ethanol for 10 min respectively, and ITO is completely immersed in ethanol ready for use;

(2) 98% concentrated sulfuric acid and 30% hydrogen peroxide, taking a ratio of 7:3, using a precision syringe to slowly add hydrogen peroxide to the concentrated sulfuric acid, as a cleaning solution, sealed for use;

(3) using Tris-HCl to adjust the acidity of the dopamine hydrochloride solution to a solution having a pH of 8 to 9; then dopamine, copper sulfate pentahydrate, and hydrogen peroxide are added in a set mass ratio to obtain a mixed solution;

(4) immersing the ITO glass soaked in ethanol into the cleaning solution for 3 seconds, taking it out, repeatedly rinsing it with ultrapure water, drying it, with the conductive surface facing up, immersed in the previously prepared mixed solution;

(5) take different batches, let stand for 20 min and 2 h respectively, take out, rinse with ultrapure water, blow dry with nitrogen, put into cell culture plate, and anneal at 30° C. for 11~13 h;

(6) Aluminizing, the aluminum wire was polished to remove the surface alumina, cut into small rods, ultrasonically cleaned in ethanol for 10 min, repeatedly cleaned twice, and plated with aluminum to successfully prepare an electrical storage device.

In the above preparation method, said ITO glass in step (1) has the size of 2 cm*2 cm.

The self-polymerization electric storage material of the present invention has strong adhesion ability, and has strong adsorption capacity on various materials surface, even on a wet substrate, and polydopamine, a natural melanin, is a polymer of dopamine, not only is of great research value in chemical structure, it shows good biocompatibility in medical research, and it exhibits many remarkable characteristics in optics, electric power, and magnetism.

Compared with existing technologies, the present invention has the advantages as follows:

(1) The invention utilizes an organic-inorganic hybrid polymer material as an organic active layer, and simultaneously completes molecular synthesis and device preparation, and prepares a series of sandwich type organic electric storage devices, and the preparation method of the active material and the device can be performed fast or slowly, it is simple, convenient and easy to operate;

(2) The organic electric storage device of the present invention successfully implements a ternary electrical storage behavior;

(3) Compared with the conventional device, the organic electrical storage device of the invention exhibits better environmental stability, and has great significance for the research direction and practical value of the organic electrical storage device;

(4) Compared with the conventional device, the organic electric storage device of the present invention exhibits good flexibility, and has great significance for the research direction and practical value of the organic electric storage device.

DETAILED DESCRIPTION OF THE INVENTION

The technical solution of the present invention will be further described below in conjunction with the drawings and specific embodiments. Unless otherwise indicated, the reagents, materials, instruments, and the like used in the following examples can be obtained by commercial means.

Figure 1:
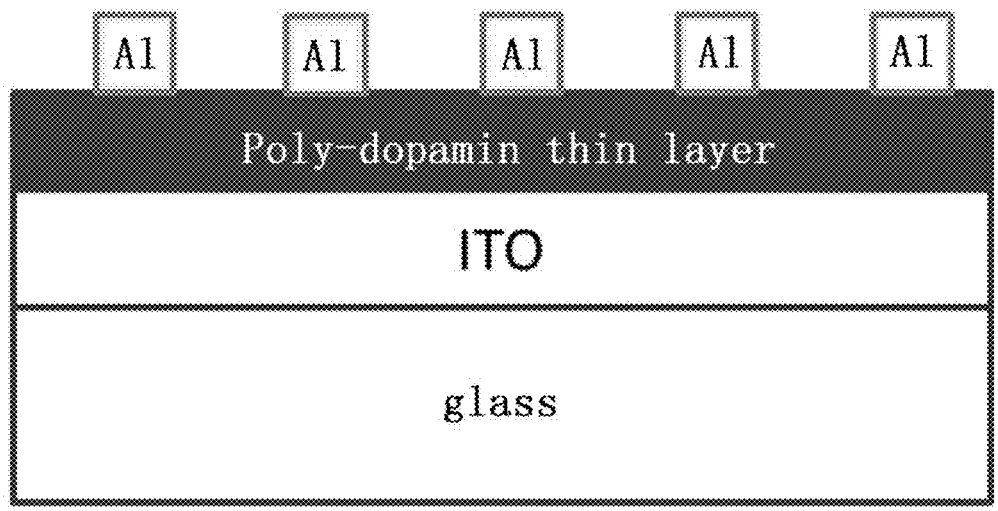
FIG. 1 is a schematic view showing the layered structure of an organic electric storage device based on a polydopamine-modified ITO glass substrate prepared by the dipping method.

In this invention, the self-polymerization of dopamine in aqueous solution is used to realize the breakthrough of electrical properties of polydopamine. The ternary storage technology is realized, which realizes the one-step completion of device preparation and molecular polymerization, and solves the problem of complicated device preparation method. As shown in FIG. 1, the device is basically divided into three layers, which are a glass ITO base layer, an organic thin film (self-polymerized electrical storage material) layer, and an aluminum electrode layer from bottom to top.

Example 1

Preparing an organic electrical storage device based on a polymer (PDPA) by self-polymerization of dopamine.

The preparation method is specifically shown as follows:

(1) ITO glass is first cleaned by washing powder (the standard of washing is ITO surface is bright and transparent, no water stain), then ultrasonic cleaning with ultrapure water, acetone and ethanol for 10 min, respectively, and ITO is completely immersed in ethanol. Stay and use;

(2) Weighing hydrochloric acid-type dopamine (DPA) in ultrapure water until completely dissolved, adjusting the acidity of the hydrochloric acid-type dopamine solution to a pH value of 8.5 by using Tris-HCl, weighing the volume;

(3) adding a reagent according to a mass ratio of hydrochloric acid type dopamine, copper sulfate pentahydrate and hydrogen peroxide of 100000:12500:6664 to obtain a mixed solution;

(4) Take the ITO glass, wash it with a cleaning solution (98% concentrated sulfuric acid and 30% hydrogen peroxide, take a ratio of 7:3, slowly add hydrogen peroxide to concentrated sulfuric acid), and immerse in the cleaning solution for 3 seconds. Quickly take out, ITO is repeatedly rinsed with ultrapure water, blown dry, measure the conductive surface, put its conductive surface up, completely immersed in the mixed solution;

Take different batches, let stand for 20 min and 2 h respectively, take out, rinse with ultrapure water, blow dry with nitrogen, put into cell culture plate, and anneal at 30° C. for 12 h; AFM or SEM to detect morphology and thickness, electrochemical Testing, infrared testing, UV testing;

(5) Aluminizing, the aluminum wire was polished to remove the surface alumina, cut into small rods, ultrasonically cleaned in ethanol for 10 min, repeatedly washed twice, and plated with aluminum to successfully prepare an electrical storage device.

The aluminum electrode was evaporated on the organic thin film layer until the thickness of the aluminum electrode reached 100 nm, and the corresponding PDPA based organic electric memory device A was obtained. The evaporation conditions were as follows: the evaporation rate was 2 A/s under a vacuum of $5\times10^{-4}$ Pa.

Figure 6:
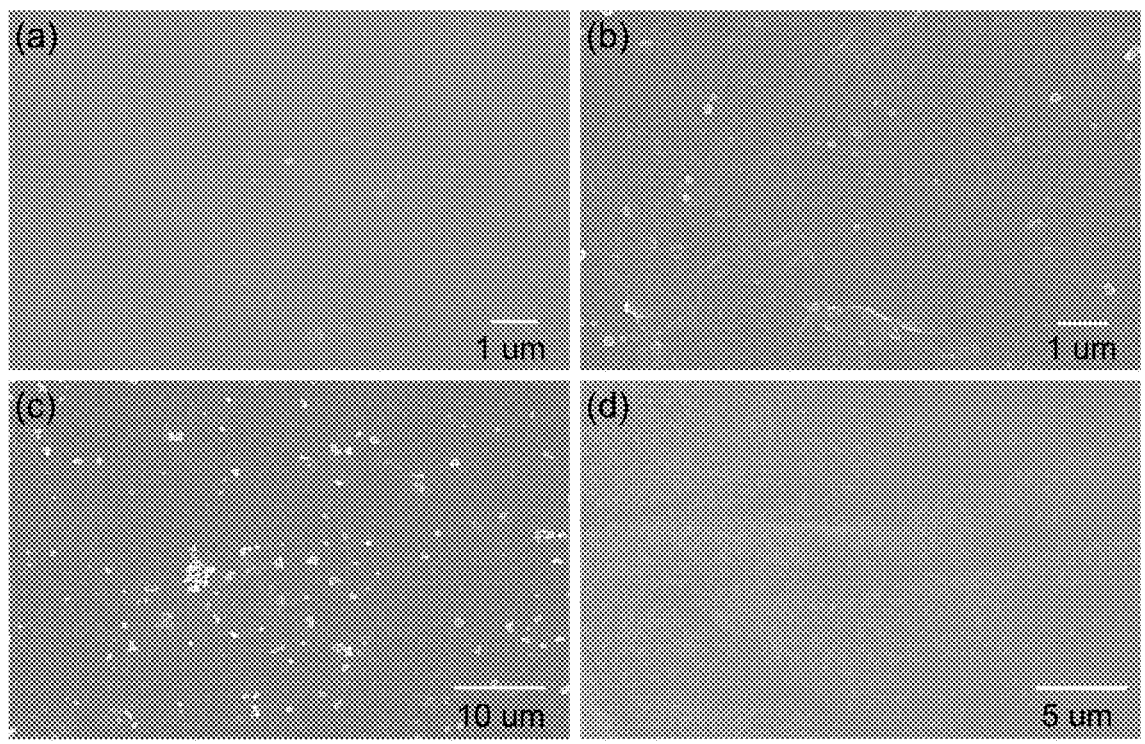
FIG. 6 is a SEM surface topography test chart of an organic electric storage device prepared by ITO in a dopamine mixed solution at different immersion times (a) 20 minutes, (b) 2 hours, (c) 3 days, and (d) 6 days.

The SEM images of the devices prepared in the above 20 minutes and 2 hours are shown in FIG. 6. The surface roughness RMS values of the device shown in FIG. 6 are (a) 1.58 nm and (b) 1.0 nm, and the organic layer thickness shown in FIG. 7. It is (a) 170 nm and (b) 187 nm.

Example 2

An organic electric storage device prepared by a polymer chain formed by self-polymerization of pure dopamine.

Figure 7:
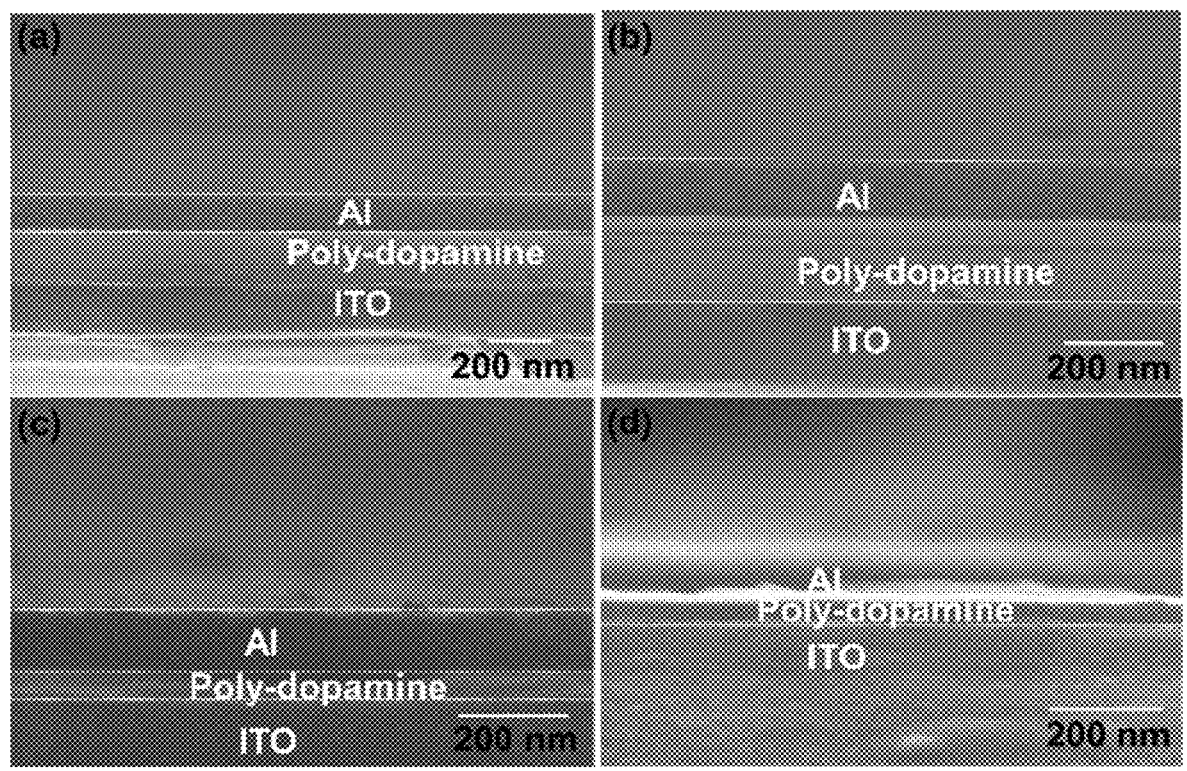
FIG. 7 is a SEM cross-sectional test chart of an organic electric storage device prepared by ITO in a dopamine mixed solution at different immersion times (a) for 20 minutes, (b) 2 hours, (c) 3 days, and (d) 6 days.

On the basis of Example 1, the step (3) is modified to: a hydrochloric acid-type dopamine mixed solution having a pH of 8.5 is weighed, without adding copper sulfate pentahydrate and hydrogen peroxide; and the step (4) is modified to: Stand for 3 days and 6 days respectively. The remaining steps were the same, and an organic electric memory device B of polydopamine based on ITO was obtained. The RMS values of the surface roughness of the device shown in FIG. 6 are (c) 6.12 nm and (d) 214 nm. The thickness of the organic layer shown in FIG. 7 is (c) 31 nm and (d) 68 nm.

From the above, it can be concluded that the film of the conductive surface prepared in the mixed solution of the hydrochloric acid-type dopamine in which copper sulfate pentahydrate and hydrogen peroxide are present has less time, has a low roughness, and has a thickness thicker than that which is not added.

Figure 2:
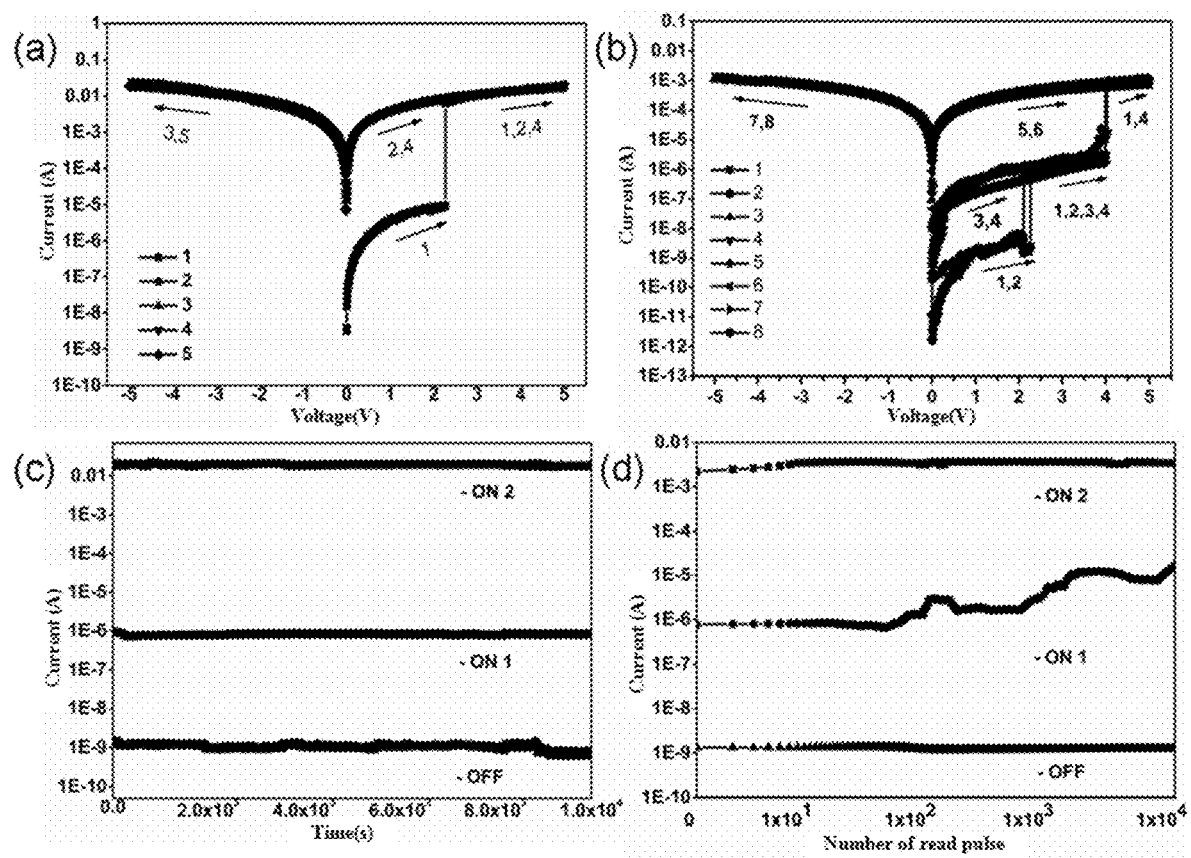
FIG. 2 is a polydopamine-modified ITO-based organic memory device prepared by dipping ITO in a dopamine mixed solution for 2 hours, and its electrical storage behavior and stability and pulse test.

FIG. 2 shows typical binary and ternary current-voltage sweeps with a ternary average yield of 51% at a 5 V voltage sweep. The first turn-on voltage of the binary of FIG. 2*a* is about 2.20 V. The turn-on voltage of the ternary of FIG. 2*b* occurs at 1.5 V and 3.5 V respectively. The test results from high impedance to high conductivity indicate that the device has the performance of writing multiple reads at a time. According to the ternary storage, three different states are selected for stability and pulse test. The results are shown in FIGS. 2*c* and *d*. The three-state current level test is performed at 10000 s. FIG. 2*c* shows that two adjacent states can be clearly distinguished. FIG. 2*d* pulse test shows that the device is not significantly degraded.

Figure 3:
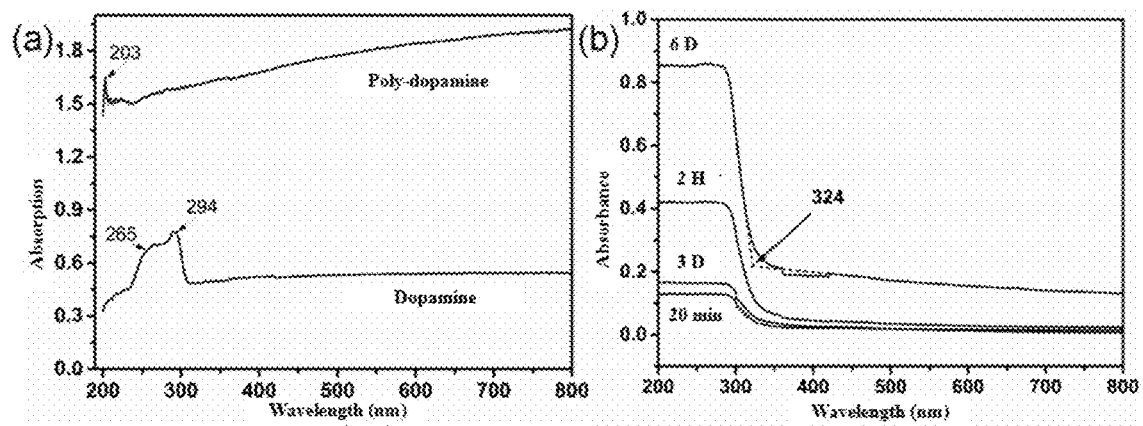
FIG. 3 is a comparison of ultraviolet absorption spectrum of powdered polydopamine and dopamine (a), ultraviolet visible absorption spectrum of organic electro-memory device (ITO as baseline scan) prepared by ITO in different doping time in dopamine mixed solution (b)
Figure 4:
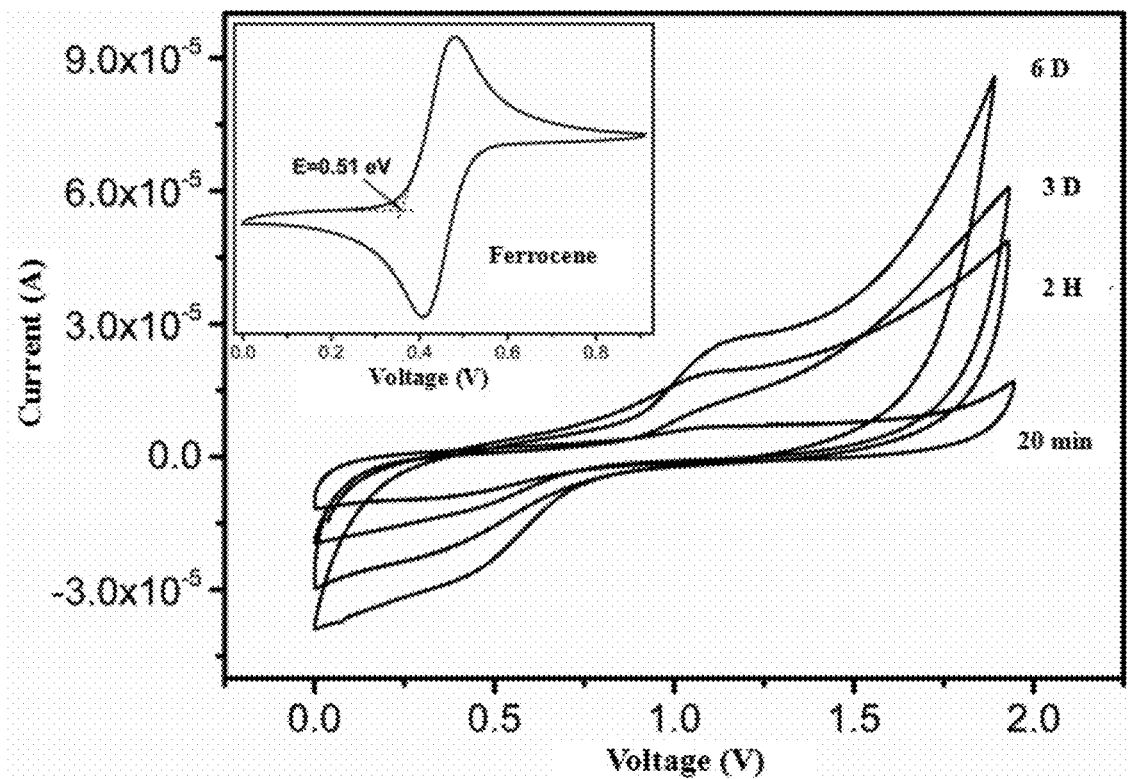
FIG. 4 is a cyclic voltammetric scanning of organic electrical storage devices prepared by different doping times (20 minutes, 2 hours, 3 days, 6 days) of dopamine molecules, using a mixed solution of acetonitrile and tetrabutylammonium hexafluorophosphate as an electrolyte, ferrocene as a standard, a platinum wire as a reference electrode, a platinum plate as a counter electrode, and an ITO-based polydopamine film as a working electrode.
Figure 5:
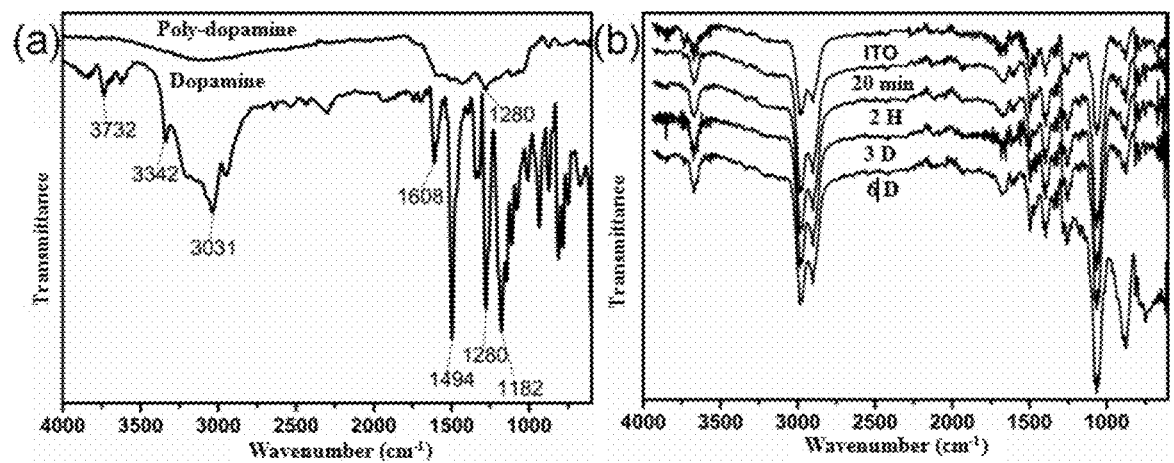
FIG. 5 is Fourier infrared absorption spectrum of polydopamine and dopamine (a), Fourier infrared absorption spectrum of an organic electric storage device prepared with ITO in a dopamine mixed solution with different dipping time (b)

As shown in FIG. 3-4, in the range of UV absorption from 200 nm to 800 nm dopamine and polydopamine, more and more conjugated structures lead to absorption of polydopamine at 800-400 nm in the range of dopamine polymerization. A value greater than the absorption of dopamine demonstrates the formation of polydopamine. The infrared test of FIG. 5 can further confirm the formation of polydopamine. The characteristic light transmittance of polydopamine is weaker than that of dopamine monomer. The reason is that the relative reduction of aromatic hydrogen leads to a significant correlation of the absorption band.

This is also due to the fact that the absorption vibration is related to the mutual traction caused by the ruthenium structure formed during the dopamine assembly process, indicating the successful synthesis of polydopamine. The above results illustrate the successful preparation of polydopamine films.

Example 3

The ternary turn-on voltage and yield of the electrical storage device having the modified layer prepared by different methods and different processing methods were counted.

The device was placed in a 4200-SCS semiconductor analyzer and the impedance of the device was tested by adjusting the voltage from −5 V to 5 V at room temperature.

Figure 8:
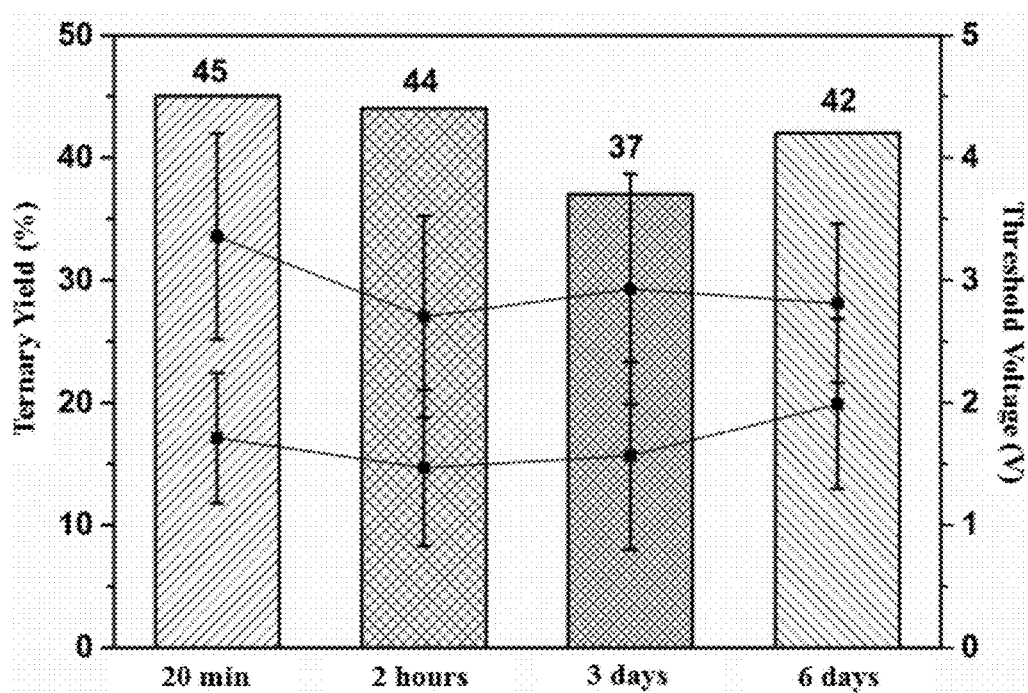
FIG. 8 is a first turn-on voltage, a second turn-on voltage, and a ternary output rate statistics of a ternary organic electric memory device prepared by ITO in a dopamine mixed solution at different immersion times (20 minutes, 2 hours, 3 days, 6 days)

The test data of different devices are counted, and the average ternary turn-on voltage is calculated. The result is shown in FIG. 8. It can be seen that the polydopamine thin film device prepared by the dipping method has the lowest opening voltage and the minimum opening energy required for the low opening voltage.

The test data of different devices were counted, and the ternary yield was calculated. The results are shown in FIG. 8. It can be seen that the ternary yields of the polydopamine prepared by the impregnation method at different times are not much different, but the device yield of copper sulfate pentahydrate and hydrogen peroxide is higher than that of the unadded reaction time high.

Figure 9:
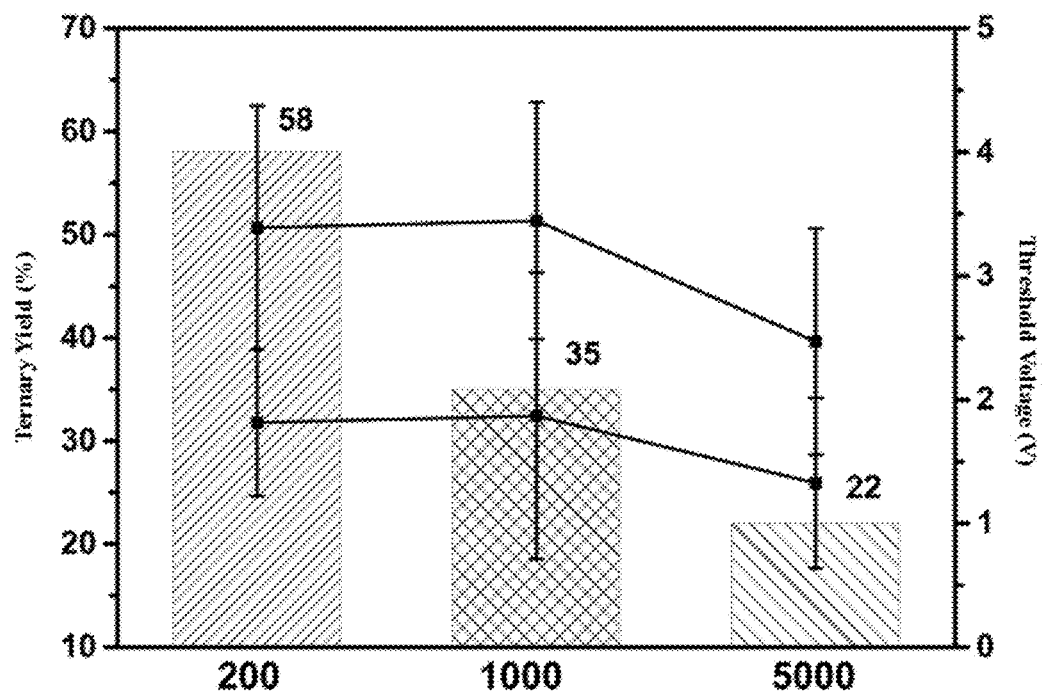
FIG. 9 is the first turn-on voltage, the second turn-on voltage and the ternary yield of the ternary under different bending times.

The test data of the flexible device is counted, and its average ternary turn-on voltage is calculated. The result is shown in FIG. 9. It can be seen that the PET-ITO device modified by polydopamine has a lower turn-on voltage and a lower turn-on voltage in order to reduce energy consumption when the number of bends and the bending rate are continuously increased.

Figure 10:
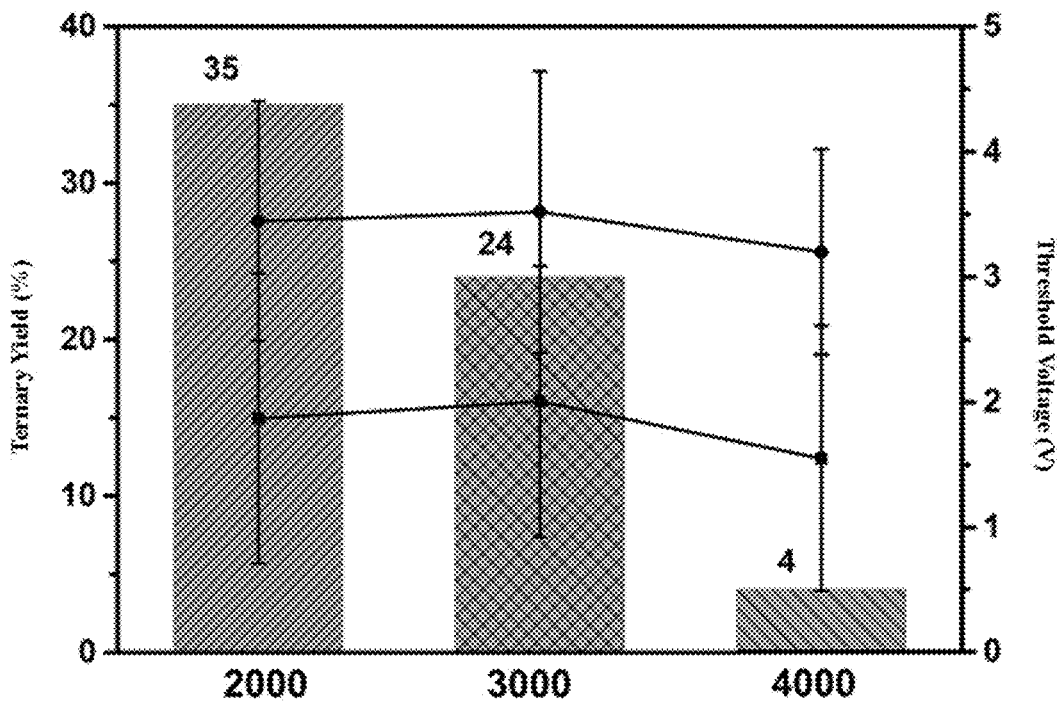
FIG. 10 shows the first turn-on voltage, the second turn-on voltage, and the ternary yield for the ternary at different bend rates.

The test data of the flexible device was counted, and the ternary yield was calculated. The results are shown in FIGS. 9 and 10. It can be seen from the above that in the PET-ITO device modified by polydopamine, the ternary yield is decreased and the yield is increased, and the ternary yield is increased in the case where the number of bending times and the bending rate are continuously increased. The decline is the fastest.

Table 1 shows the orbits occupied by the ultraviolet and electrochemical tests and the corresponding calculations. Table 2 shows the flexible test. Shows the storage performance statistics under the same bending rate, different number of bends and the same number of bends, different bend rates.

As shown in FIGS. 3*b* and 4 and the table below, the four films were subjected to cyclic voltammetry in anhydrous acetonitrile to give initial redox potentials of 3.83 eV, 3.79 eV, 3.73 eV and 3.7 eV. This shows that different experimental conditions have little effect on the molecular band gap, indicating that the molecule has strong antioxidant capacity. The energy barrier between the work function of ITO and the HOMO energy level of devices prepared under different experimental conditions were −0.47 eV, −0.39 eV, −0.51 eV and −0.54 eV, respectively. The energy barriers between the LUMO energy levels of the devices prepared by the work function and the experimental conditions were −0.82 eV, −0.78 eV, respectively −0.96 eV and −1.02 eV. It means that holes from ITO to polydopamine molecules are easier than electrons from molecules to aluminum, indicating that charge transport is dominated by holes, i.e., holes are predominantly conductive.

TABLE 1

Occupy orbitals by UV and electrochemical tests
and corresponding calculated molecules

| Reaction time | $\lambda_{onset}$ (nm) | $E_g$ (eV) | $E_{onset}$ (eV) | HOMO (eV) | LUMO (eV) | Φ Al-HOMO | Φ Al-LUMO |
|---|---|---|---|---|---|---|---|
| 20 minutes | 324 | 3.83 | 0.84 | −5.27 | −1.44 | −0.47 | −0.82 |
| 2 hours | 327 | 3.79 | 0.76 | −5.19 | −1.4 | −0.39 | −0.78 |
| 3 days | 332 | 3.73 | 0.88 | −5.31 | −1.58 | −0.51 | −0.96 |
| 6 days | 335 | 3.7 | 0.91 | −5.34 | −1.64 | −0.54 | −1.02 |

As shown in FIGS. 9 and 10 and Table 2, the same force was applied to PET-ITO. Under 5,000 bends, the ternary yield was still 22%, which fully demonstrated that the flexibility of dopamine was good; With increasing numbers, the ternary yield dropped from 35% to 4%, indicating that the polydopamine device has a bending limit of 32%. The bending rate is calculated as the ratio of the chord length after bending to the original length.

TABLE 2

Storage performance statistics

| treatment | Bend number test | | | Bent rate test | | |
|---|---|---|---|---|---|---|
| Bend number | 200 | 1000 | 5000 | 1000 | | |
| Bend rate | | 14% | | 14% | 24% | 32% |
| Radius (R) | | 1.54 cm | | 1.54 cm | 0.69 cm | 0.63 cm |
| Numeric ratio | 58% | 35% | 22% | 35% | 24% | 4% |

In summary, the present invention successfully realizes the electrical storage behavior of the ternary WORM type by using a sandwich-structured electrical storage device based on the material of the polymer chain formed by self-polymerization of dopamine, and the device preparation process is in an aqueous solution. The reaction, a beaker can be done, no need for spin-coating equipment, as shown by the data, the devices prepared under four different conditions, the devices prepared at different reaction times show similar yields, in the presence The film of the conductive surface prepared in the mixed solution of copper sulfate pentahydrate and hydrogen peroxide in the hydrochloric acid-type dopamine has less time, has low roughness, is thicker than the unapplied, and exhibits good stability. The invention solves the problems that the preparation method of the organic electric storage device is complicated, time-consuming, poorly flexible and unstable. The electrical storage device based on the material of the polymer chain formed by self-polymerization of dopamine has good research prospects and application value.

What we claim:

1. A preparation method of a self-polymerization electric storage material, comprising the following steps:
   mixing a dopamine hydrochloride solution having a pH of 8 to 9 with copper sulfate pentahydrate and hydrogen peroxide to obtain a mixed solution;
   then forming a film with the mixed solution and annealing, to obtain the self-polymerization electric storage material.

2. A preparation method of an electric storage device, comprising the following steps:
   mixing a dopamine hydrochloride solution having a pH of 8 to 9 with copper sulfate pentahydrate and hydrogen peroxide to obtain a mixed solution;
   then forming a film on the conductive surface of a conductive substrate with the mixed solution and annealing, and
   finally preparing electrodes, to obtain the electric storage device.

3. The preparation method according to claim 1, wherein the pH of said dopamine hydrochloride solution is adjusted to 8 to 9 by hydrochloric acid buffer, said dopamine hydrochloride solution is a dopamine hydrochloride aqueous solution, the concentration of said dopamine hydrochloride solution is 8 mg/mL to 11 mg/mL.

4. The preparation method according to claim 1, wherein the temperature of annealing is 30° C., time of annealing is 11 to 13 hours.

5. The preparation method according to claim 1, wherein said film is formed by dipping method at room temperature.

6. The preparation method according to claim 1, wherein the mass ratio of the dopamine hydrochloride, copper sulfate pentahydrate and hydrogen peroxide is 1000:(120 to 130): (66 to 67).

7. The preparation method according to claim 2, wherein the conductive substrate is sequentially washed with washing powder, acetone, ethanol, and a cleaning solution, said cleaning solution is selected from concentrated sulfuric acid and hydrogen peroxide.

8. The preparation method according to claim 2, wherein the pH of said dopamine hydrochloride solution is adjusted to 8 to 9 by hydrochloric acid buffer, said dopamine hydrochloride solution is a dopamine hydrochloride aqueous solution, the concentration of said dopamine hydrochloride solution is 8 mg/mL to 11 mg/mL.

9. The preparation method according to claim 2, wherein the temperature of annealing is 30° C., time of annealing is 11 to 13 hours.

10. The preparation method according to claim 2, wherein said film is formed by dipping method at room temperature.

11. The preparation method according to claim 2, wherein the mass ratio of the dopamine hydrochloride, copper sulfate pentahydrate and hydrogen peroxide is 1000:(120 to 130): (66 to 67).

* * * * *